United States Patent
Park et al.

(10) Patent No.: US 10,819,303 B1
(45) Date of Patent: Oct. 27, 2020

(54) AMPLIFIER WITH GAIN BOOSTING

(71) Applicant: QUALCOMM Incorporated, San Diego, CA (US)

(72) Inventors: Joung Won Park, San Diego, CA (US); Bo Sun, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/656,310

(22) Filed: Oct. 17, 2019

(51) Int. Cl.
| H04B 1/04 | (2006.01) |
| H03G 3/30 | (2006.01) |
| H01L 23/66 | (2006.01) |
| H01L 25/18 | (2006.01) |
| H03F 1/02 | (2006.01) |
| H03F 3/45 | (2006.01) |

(52) U.S. Cl.
CPC .......... *H03G 3/3042* (2013.01); *H01L 23/66* (2013.01); *H01L 25/18* (2013.01); *H03F 1/0205* (2013.01); *H03F 3/45183* (2013.01); *H04B 1/0475* (2013.01); *H01L 2223/6627* (2013.01); *H01L 2223/6655* (2013.01); *H03F 2200/222* (2013.01); *H03F 2200/267* (2013.01); *H03F 2200/301* (2013.01); *H03F 2200/451* (2013.01); *H03F 2203/45178* (2013.01); *H03F 2203/45201* (2013.01); *H03G 2201/103* (2013.01); *H04B 2001/0416* (2013.01)

(58) Field of Classification Search
CPC ...... H04B 1/04; H04B 1/0485; H03G 3/3042; H01L 23/66; H01L 25/18; H03F 1/0205; H03F 1/26; H03F 3/45183
See application file for complete search history.

(56) References Cited

U.S. PATENT DOCUMENTS

2012/0286874 A1* 11/2012 Kim .................. H03F 1/26
330/291
2018/0083584 A1* 3/2018 Yuan ................ H03G 3/002

OTHER PUBLICATIONS

Sameh Ibrahim., et al., "Low-Power CMOS Equalizer Design for 20-Gb/s Systems", IEEE Journal of Solid-State Circuits, Jun. 2011, vol. 46, No. 6, pp. 1321-1336.

* cited by examiner

*Primary Examiner* — Thanh C Le
(74) *Attorney, Agent, or Firm* — Loza & Loza, LLP/Qualcomm

(57) ABSTRACT

In certain aspects, an amplifier includes a first transistor including a gate, a drain, and a source, wherein the gate of the first transistor is coupled to a first input of the amplifier. The amplifier also includes a second transistor including a gate, a drain, and a source, wherein the gate of the second transistor is coupled to a second input of the amplifier. The amplifier further includes a first signal path coupled between the first input of the amplifier and the source of the second transistor, a second signal path coupled between the second input of the amplifier and the source of the first transistor, a first load coupled to the drain of the first transistor, and a second load coupled to the drain of the second transistor.

30 Claims, 13 Drawing Sheets

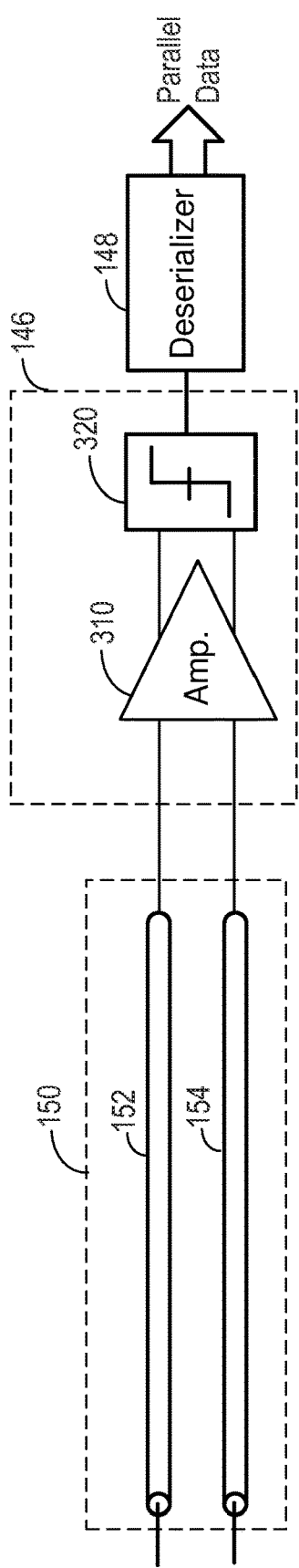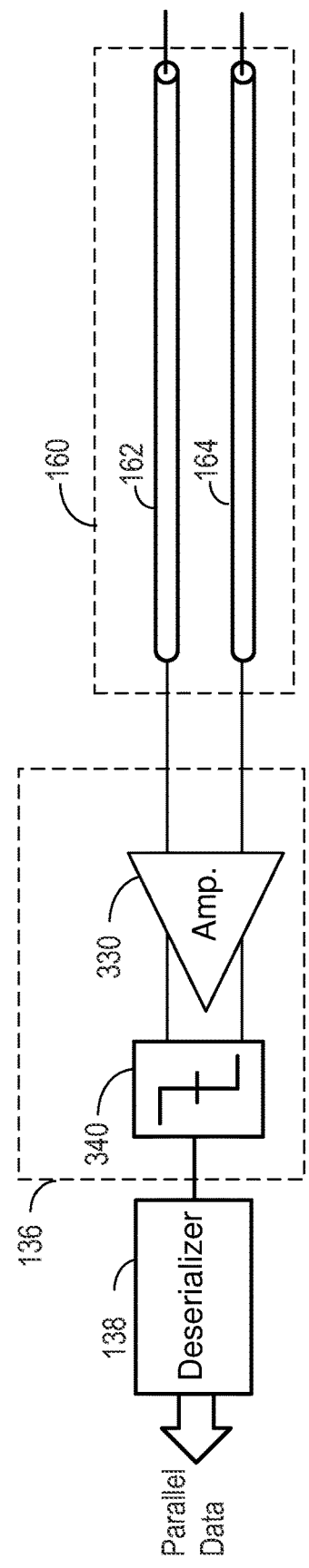

AMPLIFIER WITH GAIN BOOSTING

BACKGROUND

Field

Aspects of the present disclosure relate generally to signal amplification, and more particularly, to amplifiers.

Background

In a system, signals may be transmitted from a transmitting device to a receiving device across a channel. The channel may act as a low-pass filter in which the channel attenuates signals by an increasing amount at high frequencies. The frequency-dependent attenuation can cause distortions in signals transmitted across the channel, especially at high frequencies. To address this, the receiving device may include an amplifier with gain boosting at high frequencies to compensate for high signal attenuation at high frequencies.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an amplifier. The amplifier includes a first transistor including a gate, a drain, and a source, wherein the gate of the first transistor is coupled to a first input of the amplifier. The amplifier also includes a second transistor including a gate, a drain, and a source, wherein the gate of the second transistor is coupled to a second input of the amplifier. The amplifier further includes a first signal path coupled between the first input of the amplifier and the source of the second transistor, a second signal path coupled between the second input of the amplifier and the source of the first transistor, a first load coupled to the drain of the first transistor, and a second load coupled to the drain of the second transistor.

A second aspect relates to a system. The system includes a transmitter, and a channel coupled to an output of the transmitter, the channel comprising a first transmission line and a second transmission line. The system also includes an amplifier having a first input and a second input, wherein the first input is coupled to the first transmission line of the channel, and the second input is coupled to the second transmission line of the channel. The amplifier includes a first transistor including a gate, a drain, and a source, wherein the gate of the first transistor is coupled to the first input of the amplifier. The amplifier also includes a second transistor including a gate, a drain, and a source, wherein the gate of the second transistor is coupled to the second input of the amplifier. The amplifier further includes a first signal path coupled between the first input of the amplifier and the source of the second transistor, a second signal path coupled between the second input of the amplifier and the source of the first transistor, a first load coupled to the drain of the first transistor, and a second load coupled to the drain of the second transistor.

A third aspect relates to a method for increasing a gain of an amplifier, wherein the amplifier includes a first transistor, a second transistor, a first load coupled to a drain of the first transistor, and a second load coupled to a drain of the second transistor. The method includes driving a gate of the first transistor with a first input signal, driving a gate of the second transistor with a second input signal, coupling the first input signal to a source of the second transistor, and coupling the second input signal to a source of the first transistor.

A fourth aspects relates to an apparatus for increasing a gain of an amplifier, wherein the amplifier includes a first transistor, a second transistor, a first load coupled to a drain of the first transistor, and a second load coupled to a drain of the second transistor. The apparatus includes means for driving a gate of the first transistor with a first input signal, means for driving a gate of the second transistor with a second input signal, means for coupling the first input signal to a source of the second transistor, and means for coupling the second input signal to a source of the first transistor.

BRIEF DESCRIPTION OF THE DRAWINGS

FIG. 3A shows an example of a receiver including an amplifier according to certain aspects of the present disclosure.

FIG. 3B shows another example of a receiver including an amplifier according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
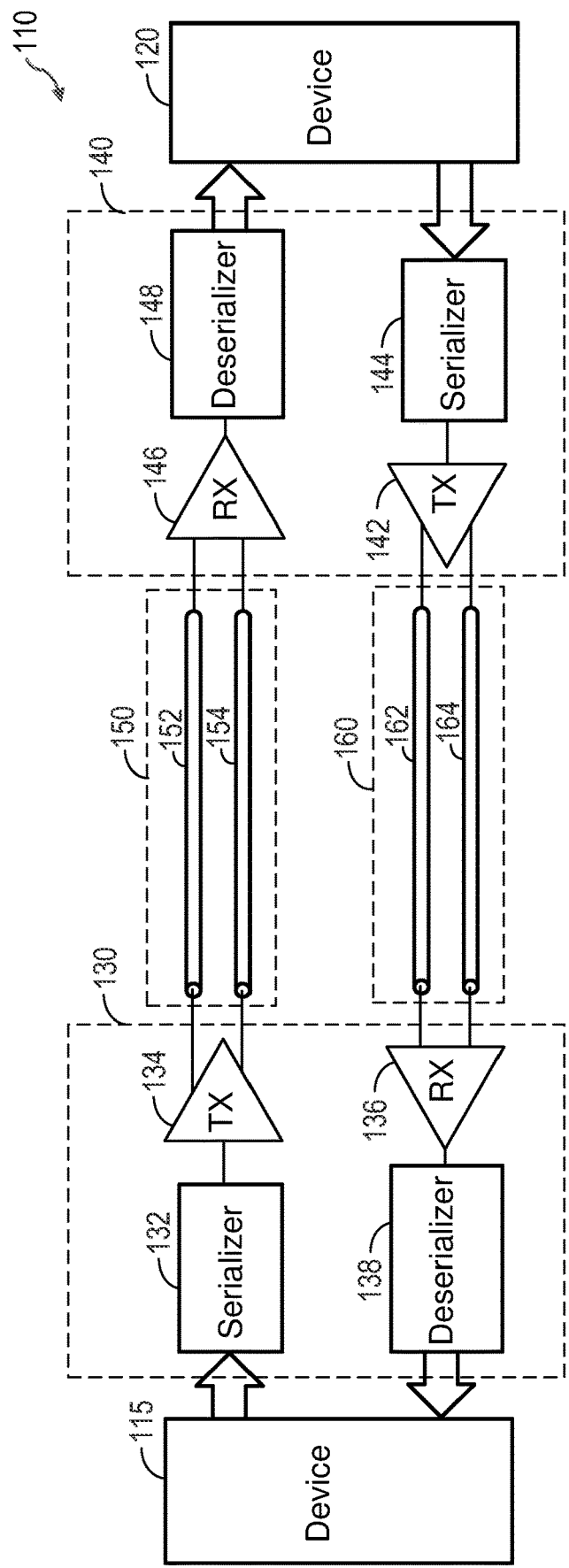
FIG. 1A shows an exemplary system including a first device and a second device according to certain aspects of the present disclosure.

FIG. 1A shows an example of a system 110 according to aspects of the present disclosure. The system 110 includes a first device 115, a second device 120, a first Serializer/Deserializer (SerDes) interface 130, and a second SerDes interface 140. The first SerDes interface 130 and the second SerDes interface 140 facilitate high-speed communication between the first device 115 and the second device 120 over one or more serial channels (also referred to as serial links). An advantage of SerDes is that SerDes reduces the number of input/output (I/O) pins and channels needed for communication between the first device 115 and the second device 120.

The first SerDes interface 130 includes a first serializer 132, a first transmitter 134, a first receiver 136, and a first deserializer 138. The second SerDes interface 140 includes a second serializer 144, a second transmitter 142, a second receiver 146, and a second deserializer 148. The first transmitter 134 is coupled to the second receiver 146 via a first channel 150, and the second transmitter 142 is coupled to the first receiver 136 via a second channel 160. In the example in FIG. 1A, the first channel 150 is a differential channel including a first transmission line 152 and a second transmission line 154, and the second channel 160 is a differential channel including a third transmission line 162 and a fourth transmission line 164.

The first serializer 132, the first transmitter 134, the second receiver 146 and the second deserializer 148 facilitate communication from the first device 115 to the second device 120 over the first channel 150. In this regard, the first serializer 132 is configured to receive parallel data from the first device 115, and convert the received parallel data into a serial data stream (e.g., serial data bits). The first transmitter 134 is configured to transmit the serial data stream as a differential data signal over the first channel 150.

The second receiver 146 is configured to receive the differential data signal from the first transmitter 134 over the first channel 150, and convert the differential data signal into a serial data stream. The second deserializer 148 is configured to convert the serial data stream from the second receiver 146 into parallel data, and output the parallel data to the second device 120.

The second serializer 144, the second transmitter 142, the first receiver 136 and the first deserializer 138 facilitate communication from the second device 120 to the first device 115 over the second channel 160. In this regard, the second serializer 144 is configured to receive parallel data from the second device 120, and convert the received parallel data into a serial data stream (e.g., serial data bits). The second transmitter 142 is configured to transmit the serial data stream as a differential data signal over the second channel 160.

The first receiver 136 is configured to receive the differential data signal from the second transmitter 142 over the second channel 160, and convert the differential data signal into a serial data stream. The first deserializer 138 is configured to convert the serial data stream from the first receiver 136 into parallel data, and output the parallel data to the first device 115. Thus, the first SerDes interface 130 and the second SerDes interface 140 facilitate bidirectional communication between the first device 115 and the second device 120.

Figure 1B:
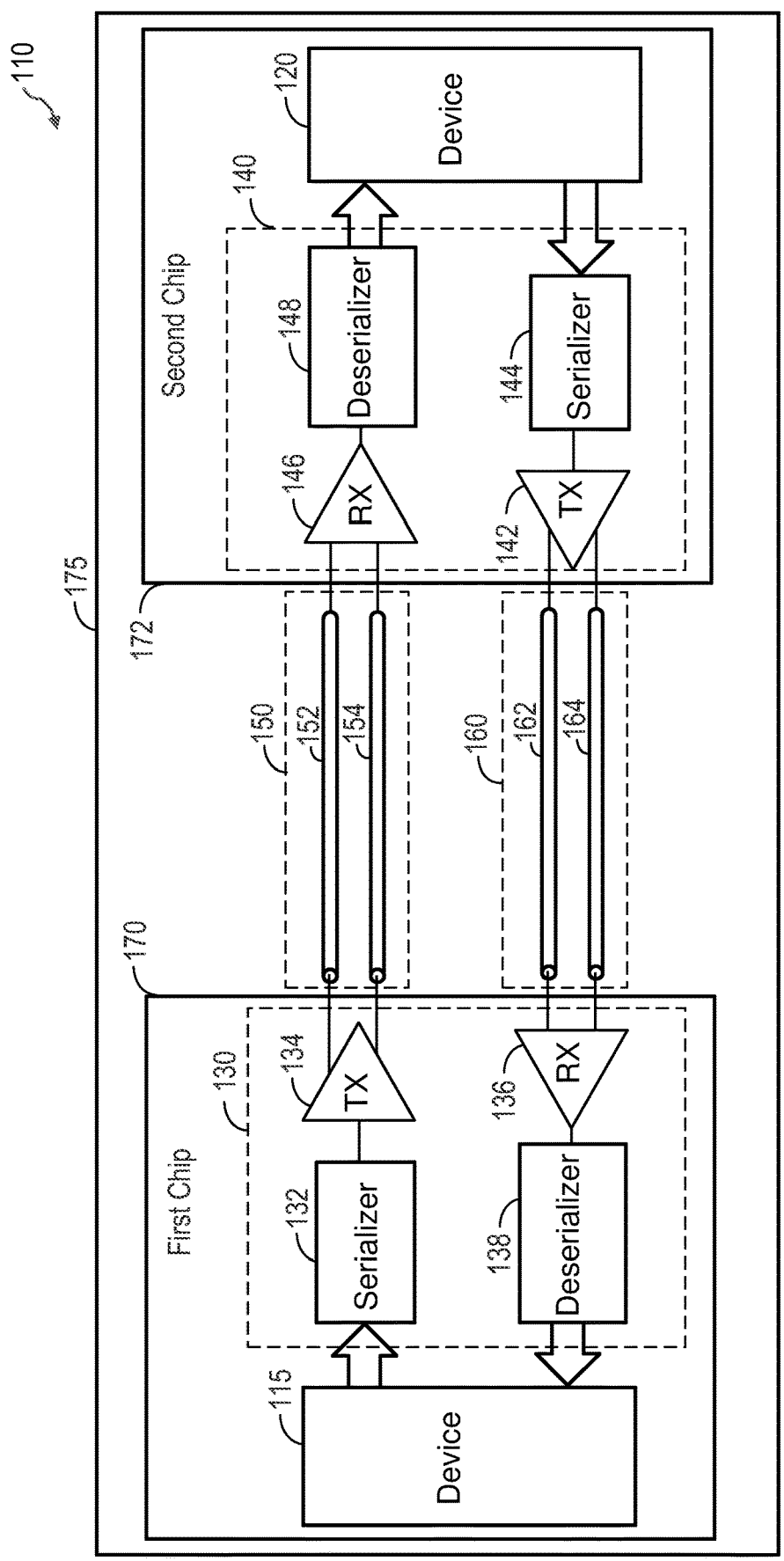
FIG. 1B shows an example in which the first device is integrated on a first chip and the second device is integrated on a second chip according to certain aspects of the present disclosure.

FIG. 1B shows an example in which the first device 115 and the first SerDes interface 130 are integrated on a first chip 170, and the second device 120 and the second SerDes interface 140 are integrated on a second chip 172. In this example, the first SerDes interface 130 and the second SerDes interface 140 facilitate chip-to-chip communication between the first device 115 and the second device 120. The first chip 170 and the second chip 172 may be mounted on a substrate 175 (e.g., a printed circuit board (PCB), ceramic, etc.). In this example, the first transmission line 152 may include a first metal trace on the substrate 175, the second transmission line 154 may include a second metal trace on the substrate 175, the third transmission line 162 may include a third metal trace on the substrate 175, and the fourth transmission line 164 may include a fourth metal trace on the substrate 175.

Figure 1C:
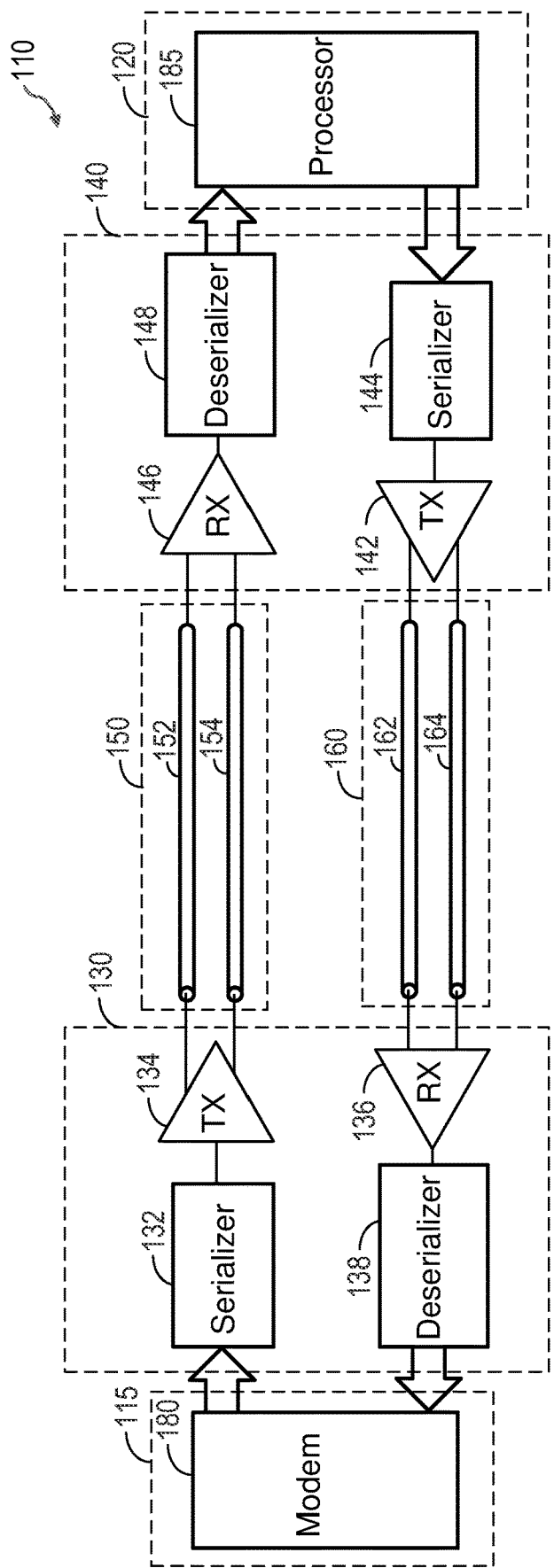
FIG. 1C shows an example in which the first device includes a modem and the second device includes a processor according to certain aspects of the present disclosure.

In certain aspects, the system 110 may be part of a wireless mobile device (e.g., handset) including the first device 115 and the second device 120. FIG. 1C shows one example in which the first device 115 includes a modem 180 (e.g., cellular modem) and the second device 120 includes a processor 185, in which the first SerDes interface 130 and the second SerDes interface 140 facilitate bidirectional communication between the modem 180 and the processor 185. In this example, the modem 180 is configured to support wireless communication between the processor 185 and a wireless communication device (e.g., a base station, an access point, etc.). In this regard, the modem 180 may be configured to receive radio frequency (RF) signals from the wireless communication device via one or more antennas (not shown), convert the RF signals into parallel data, and output the parallel data to the first SerDes interface 130 for transmission to the processor 185 via the first channel 150. The modem 180 may also be configured to receive data from the processor 185 via the first SerDes interface 130, convert the data into RF signals, and transmit the RF signals to the wireless communication device via the one or more antennas. The modem 180 may include an RF front-end circuit and a baseband processor. The processor 185 may include a processor core, a digital signal processor (DSP), an application specific integrated circuit (ASIC), a field programmable gate array (FPGA) or other programmable logic device, or any combination thereof.

Figure 1D:
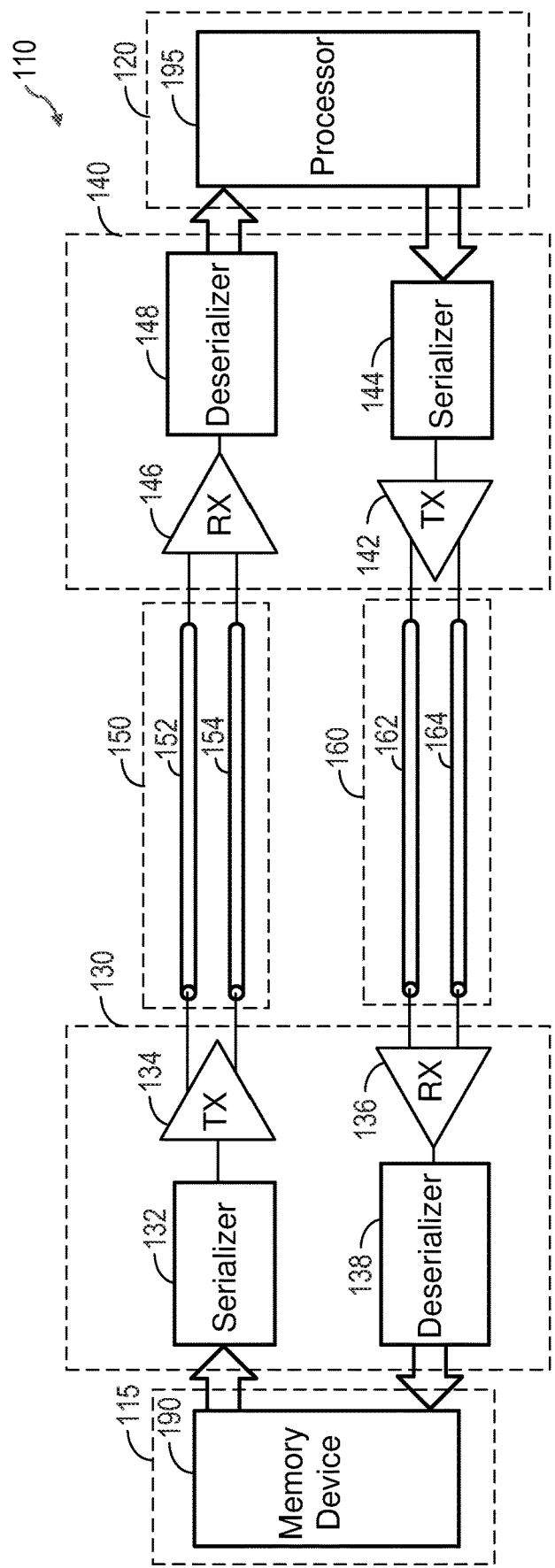
FIG. 1D shows an example in which the first device includes a memory device and the second device includes a processor according to certain aspects of the present disclosure.

FIG. 1D shows another example in which the first device 115 includes a memory device 190 and the second device 120 includes a processor 195. In this example, the first SerDes interface 130 and the second SerDes interface 140 provides the processor 195 with high-speed access to the memory device 190. The memory device 190 may include a dynamic random-access memory (DRAM) device (e.g., double-data rate (DDR) DRAM device) or another type of memory device. The processor 195 may include a processor core, a digital signal processor (DSP), an application specific integrated circuit (ASIC), a field programmable gate array (FPGA) or other programmable logic device, or any combination thereof.

It is to be appreciated that the present disclosure is not limited to the above examples, and that the first device 115 and the second device 120 may include other types of devices.

Figure 2:
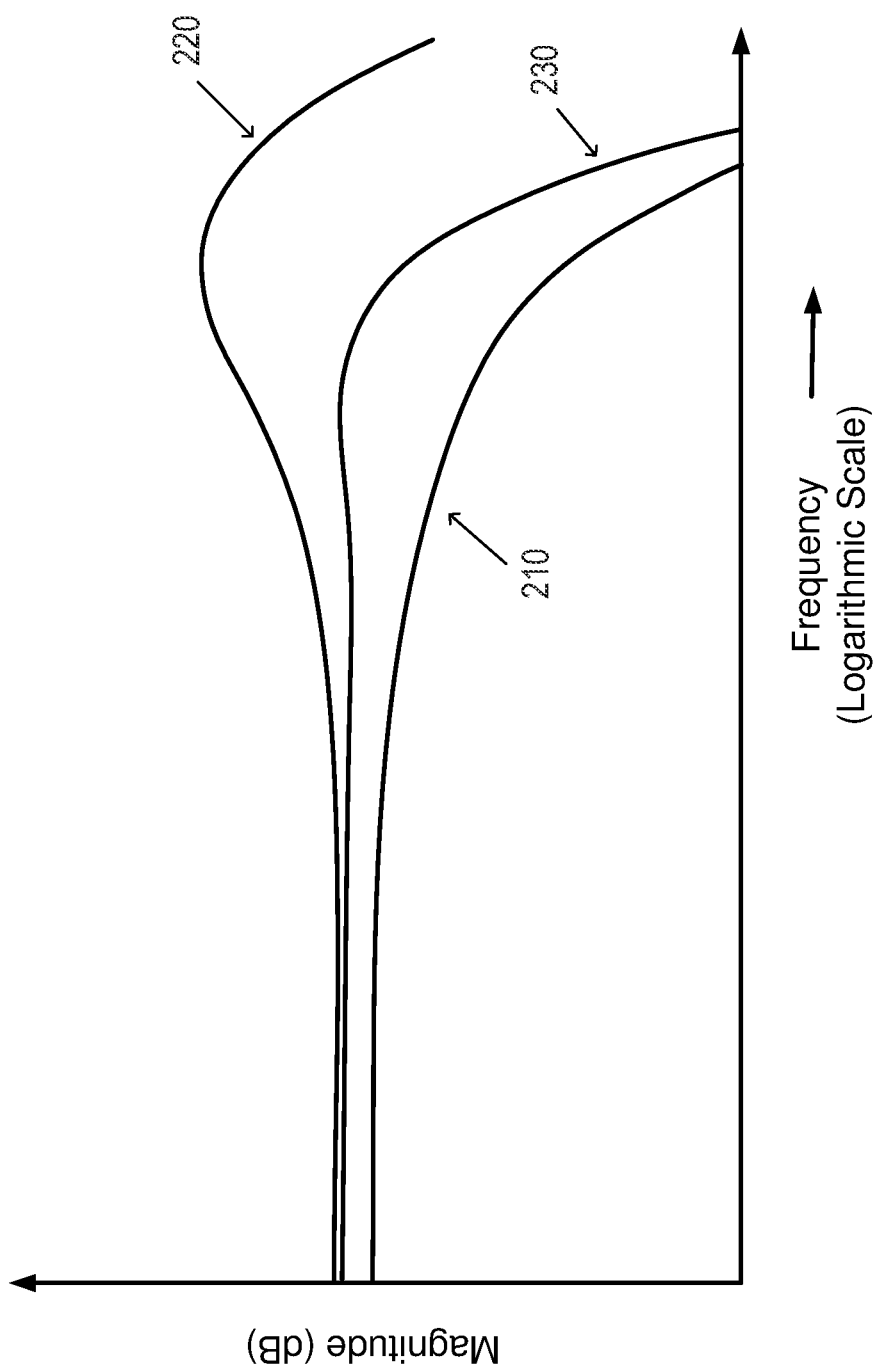
FIG. 2 is a plot showing an exemplary frequency response of a channel and an exemplary frequency response of an amplifier with gain boosting at high frequencies according to certain aspects of the present disclosure.

The first channel 150 may act as a low-pass filter in which the first channel 150 attenuates signals by an increasing amount at high frequencies. An example of this is illustrated in FIG. 2, which shows an example of a frequency response 210 of the first channel 150. In FIG. 2, the vertical axis shows signal magnitude in decibels (dB) and the horizontal axis shows frequency on a logarithmic scale. As shown in FIG. 2, the frequency response 210 of the first channel 150 rolls off at high frequencies indicating increasing signal attenuation (i.e., signal loss) at high frequencies. The high signal attenuation at high frequencies makes it increasing challenging to transmit data over the first channel 150 at ever increasing data rates (e.g., multiple gigabits per second).

To compensate for the high signal attenuation at high frequencies, the second receiver 146 may include an amplifier with gain boosting at high frequencies (also referred to as an equalizer). In this regard, FIG. 3A shows an example in which the second receiver 146 includes an amplifier 310 coupled to the first channel 150. The gain of the amplifier 310 increases at high frequencies to compensate for the increasing signal attenuation (i.e., signal loss) in the first channel 150 at high frequencies. An example of this is illustrated in FIG. 2, which shows an example of a frequency response 220 of the amplifier 310. As shown in FIG. 2, the gain of the amplifier 310 is boosted at high frequencies to compensate for the increasing signal attenuation in the first channel 150 at high frequencies. As a result, the combined frequency response 230 of the first channel 150 and the amplifier 310 is approximately flat over a wider frequency band, which increases the rate at which data can be transmitted over the first channel 150. Thus, the amplifier 310 allows data to be sent over the first channel 150 at higher data rates.

In the example in FIG. 3A, the second receiver 146 also includes a slicer 320 coupled to the output of the amplifier 310. The slicer 320 is configured to convert the output signal of the amplifier 310 into a serial data stream (e.g., serial data bits), which is output to the second deserializer 148. As discussed above, the second deserializer 148 converts the serial data stream into parallel data, which may be output to the second device 120 (shown in FIG. 1A). It is to be appreciated that the second receiver 146 may also include one or more additional elements not shown in FIG. 3A (e.g., a pre-amplifier, a clock data recovery (CDR) circuit, etc.).

FIG. 3B shows an example in which the first receiver 136 includes an amplifier 330 with gain boosting at high frequencies to compensate for high signal attenuation (i.e., signal loss) in the second channel 160 at high frequencies. In this example, the second channel 160 may have a similar frequency response 210 as the first channel 150, and the amplifier 330 may have a similar frequency response 220 as the amplifier 310 in the second receiver 146. In this example, the gain of the amplifier 330 is boosted at high frequencies to compensate for increasing signal attenuation in the second channel 160 at the high frequencies.

In this example, the first receiver 136 also includes a slicer 340 coupled to the output of the amplifier 330. The slicer 340 is configured to convert the output signal of the amplifier 330 into a serial data stream (e.g., serial data bits), which is output to the first deserializer 138. As discussed above, the first deserializer 138 converts the serial data stream into parallel data, which may be output to the first device 115 (shown in FIG. 1A). It is to be appreciated that the first receiver 136 may also include one or more additional elements not shown in FIG. 3B (e.g., a pre-amplifier, a clock data recovery (CDR) circuit, etc.).

Figure 4:
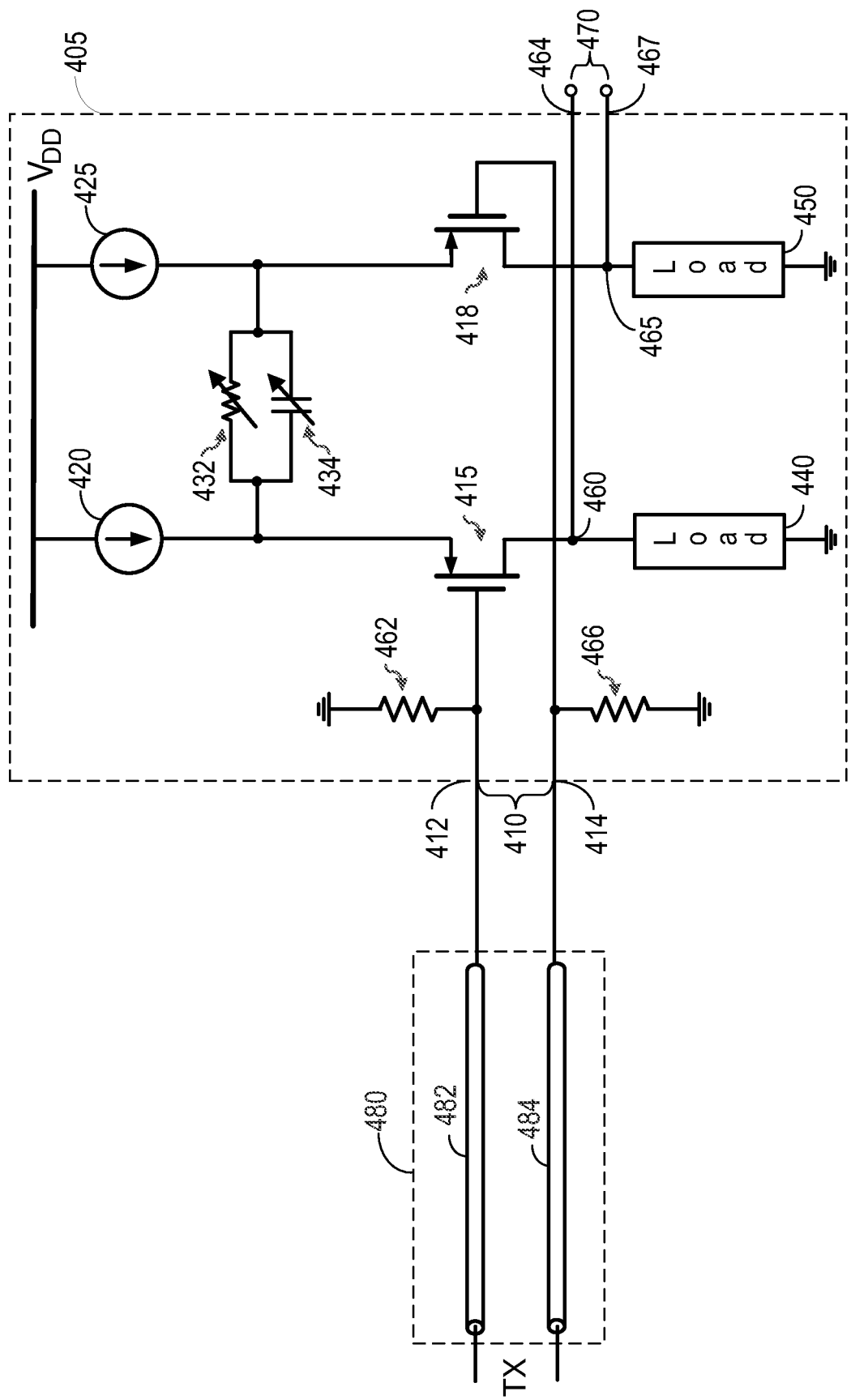
FIG. 4 shows an example of an amplifier including a source resistor and a source capacitor according to certain aspects of the present disclosure.

FIG. 4 shows an example of an amplifier 405 according to aspects of the present disclosure. The amplifier 405 may be used to implement the amplifier 310 in the second receiver 146 and the amplifier 330 in the first receiver 136 (i.e., the amplifier 310 and the amplifier 330 may each be a separate instance of the amplifier 405 shown in FIG. 4).

The amplifier 405 has a differential input 410 including a first input 412 and a second input 414. The differential input 410 may be coupled to a channel 480 including a first transmission line 482 and a second transmission line 484. The first input 412 of the amplifier 405 may be coupled to the first transmission line 482 of the channel 480, and the second input 414 of the amplifier 405 may be coupled to the second transmission line 484 of the channel 480. For the example in which the amplifier 405 implements the amplifier 310 in the second receiver 146, the channel 480 corresponds to the first channel 150, the first transmission line 482 corresponds to the first transmission line 152, and the second transmission line 484 corresponds to the second transmission line 154. For the example in which the amplifier 405 implements the amplifier 330 in the first receiver 136, the channel 480 corresponds to the second channel 160, the first transmission line 482 corresponds to the third transmission line 162, and the second transmission line 484 corresponds to the fourth transmission line 164.

In the example in FIG. 4, the amplifier 405 has a differential output 470 including a first output 464 and a second output 467. The differential output 470 may be coupled to the input of a slicer. For the example in which the amplifier 405 implements the amplifier 310 in the second receiver 146, the differential output 470 may be coupled to the slicer 320 shown in FIG. 3A. For the example in which the amplifier 405 implements the amplifier 330 in the first receiver 136, the differential output 470 may be coupled to the slicer 340 shown in FIG. 3B.

The amplifier 405 is configured to receive a differential input signal from the channel 480 at the differential input 410, amplify the received differential input signal by a gain to generate a differential output signal, and output the differential output signal at the differential output 470. As discussed further below, the gain of the amplifier 405 is boosted at high frequencies to compensate for high signal attenuation (i.e., signal loss) in the channel 480 at high frequencies. The differential input signal may correspond to the differential data signal transmitted by the first transmitter 134 or the second transmitter 142 discussed above.

In the example in FIG. 4, the amplifier 405 includes a first transistor 415 and a second transistor 418. The gate of the first transistor 415 is coupled to the first input 412 of the amplifier 405, and the gate of the second transistor 418 is coupled to the second input 414 of the amplifier 405. In the example in FIG. 4, each of the first transistor 415 and the second transistor 418 is implemented with a p-type field effect transistor (PFET). However, it is to be appreciated that the present disclosure is not limited to this example, and that each of the first transistor 415 and the second transistor 418 may be implemented with another type of transistor (e.g., an n-type field effect transistor (NFET)).

The amplifier 405 also includes a first bias current source 420 and a second bias current source 425. The first bias current source 420 is coupled to the source of the first transistor 415, and is configured to generate a first bias current to bias the first transistor 415. The second bias current source 425 is coupled to the source of the second transistor 418, and is configured to generate a second bias current to bias the second transistor 418. The first bias current and the second bias current may each be a direct-current (DC) current. The first bias current and the second bias current may have approximately the same current level. In the example in FIG. 4, the first bias current source 420 is coupled between the source of the first transistor 415 and a voltage supply rail $V_{DD}$, and the second bias current source 425 is coupled between the source of the second transistor 418 and the voltage supply rail $V_{DD}$.

The amplifier 405 further includes a first load 440 and a second load 450. The first load 440 is coupled between the drain of the first transistor 415 and ground, and the second load 450 is coupled between the drain of the second transistor 418 and ground. Each of the first load 440 and the second load 450 may include a resistive load, an inductive load, or both a resistive load and an inductive load, as discussed further below. In the example in FIG. 4, the first output 464 of the amplifier 405 is coupled to a first output node 460 located between the drain of the first transistor 415 and the first load 440. The second output 467 of the amplifier 405 is coupled to a second node 465 located between the drain of the second transistor 418 and the second load 445.

The amplifier 405 also includes a source resistor 432 and a source capacitor 434 coupled in parallel between the source of the first transistor 415 and the source of the second transistor 418. At low frequencies, the source resistor 432 provides a source-degenerative resistance between the source of the first transistor 415 and the source of the second transistor 418, which reduces the gain of the amplifier 405 at low frequencies. The low-frequency gain of the amplifier 405 may be approximately inversely proportional to the impedance of the source resistor 432. Thus, the low-frequency gain of the amplifier 310 may be adjusted (i.e., tuned) by adjusting the impedance of the source resistor 432. In this regard, the source resistor 432 may be implemented with a variable resistor (indicated by the arrow through the source resistor 432 in FIG. 4) to provide tunability of the low-frequency gain (also referred to as DC gain).

The source capacitor 434 has a high impedance at low frequencies, which allows the source resistor 432 to reduce the gain of the amplifier 310 at low frequencies, as discussed above. The source capacitor 434 has a low impedance at high frequencies, and may approximate a short circuit path at high frequencies. Since the source capacitor 434 is coupled in parallel with the source resistor 432, the source capacitor 434 shorts the source resistor 432 at high frequencies. This substantially reduces the source-degenerative resistance between the source of the first transistor 415 and the source of the second transistor 418, causing the gain of the amplifier 310 to increase. As a result, the gain of the amplifier 405 is boosted at high frequencies to provide compensation for high signal attenuation (i.e., signal loss) in the channel 480 at high frequencies.

In the example in FIG. 4, the amplifier 405 includes a first impedance-matching resistor 462 and a second impedance-matching resistor 466. The first impedance-matching resistor 462 is coupled between the first input 412 of the amplifier 405 and ground, and the second impedance-matching resistor 466 is coupled between the second input 414 of the amplifier 405 and ground. The first impedance-matching resistor 462 is configured to provide impedance matching with the first transmission line 482, and the second impedance-matching resistor 466 is configured to provide imped- ance matching with the second transmission line 484. The impedance matching increases power transfer from the channel 480 to the amplifier 405.

Figure 5:
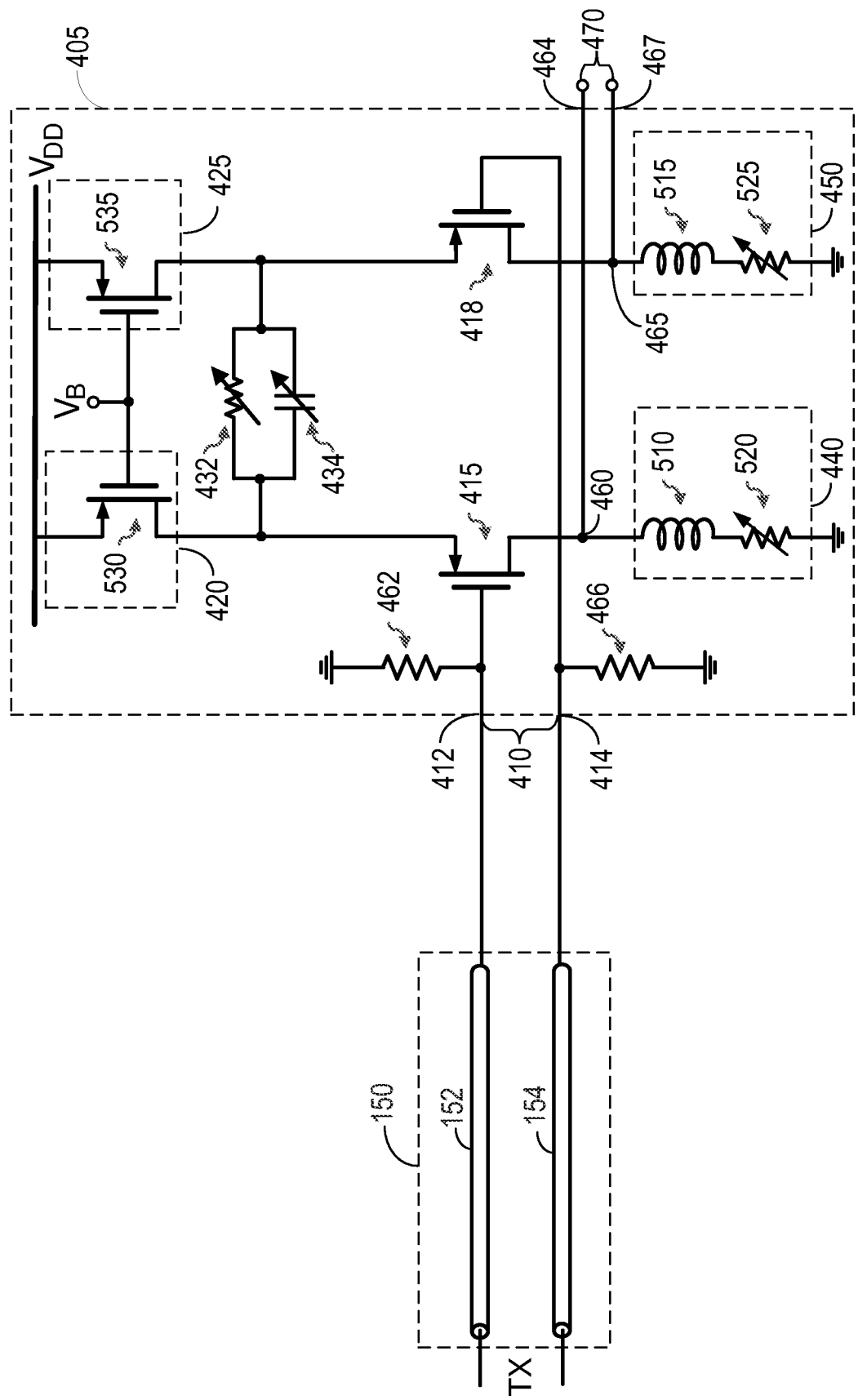
FIG. 5 shows an exemplary implementation of a load and a bias current source according to certain aspects of the present disclosure.

FIG. 5 shows an exemplary implementation of the first bias current source 420, and the second bias current source 425 according to certain aspects. In this example, the first bias current source 420 is implemented with a first current transistor 530 (e.g., a PFET) having a gate biased by a bias voltage $V_B$, a drain coupled to the source of the first transistor 415, and a source coupled to the voltage supply rail $V_{DD}$. Also, in this example, the second bias current source 425 is implemented with a second current transistor 535 (e.g., a PFET) having a gate biased by the bias voltage $V_B$, a drain coupled to the source of the second transistor 418, and a source coupled to the voltage supply rail $V_{DD}$. In this example, the current level of the first bias current is set by the bias voltage $V_B$ applied to the gate of the first current transistor 530, and the current level of the second bias current is set by the bias voltage $V_B$ applied to the gate of the second current transistor 535. It is to be appreciated that the present disclosure is not limited to the exemplary implementation shown in FIG. 5, and that each of the first bias current source 420 and the second bias current source 425 may be implemented with another type of circuit configured to generate a bias current (e.g., a DC bias current).

FIG. 5 also shows an exemplary implementation of the first load 440 and the second load 450 according to certain aspects. In this example, the first load 440 includes a first load inductor 510 and a first load resistor 520 coupled in series, and the second load 450 includes a second load inductor 515 and a second load resistor 525 coupled in series. The first load inductor 510 and the second load inductor 515 may have approximately the same inductance.

In certain aspects, the first load inductor 510 has a low impedance at low frequencies such that the impedance of the first load 440 at low frequencies is approximately equal to the impedance of the first load resistor 520. Similarly, the second load inductor 515 has a low impedance at low frequencies such that the impedance of the second load 450 at low frequencies is approximately equal to the impedance of the second load resistor 525. In one example, the first load resistor 520 may be implemented with a variable resistor (indicated by the arrow through the first load resistor 520) to provide tunability of the low-frequency impedance of the first load 440. Similarly, the second load resistor 525 may be implemented with a variable resistor (indicated by the arrow through the second load resistor 525) to provide tunability of the low-frequency impedance of the second load 450.

The low-frequency gain of the amplifier 405 is a function of the low-frequency impedance of the first load 440 and the low-frequency impedance of the second load 450. Since the low-frequency impedance of the first load 440 is approximately equal to the impedance of the first load resistor 520 and the low-frequency impedance of the second load 450 is approximately equal to the impedance of the second load resistor 525, the low-frequency gain of the amplifier 405 can be adjusted (i.e., tuned) by adjusting (i.e., tuning) the impedance of the first load resistor 520 and the impedance of the second load resistor 525. As discussed above, the low-frequency gain of the amplifier 405 may also be adjusted by adjusting the impedance of the source resistor 432. Thus, the low-frequency gain of the amplifier 405 may be adjusted (i.e., tuned) by adjusting the impedance of the first load resistor 520 and the impedance of the second load resistor 525, adjusting the impedance of the source resistor 432, or both.

In certain aspects, the impedance of the first load inductor 510 increases at high frequencies and the impedance of the second load inductor 515 increases at high frequencies. This causes the impedance of the first load 440 and the impedance of the second load 450 to increase at high frequencies. The increased impedances of the first load 440 and the second load 450 at high frequencies increases the gain of the amplifier 405 at high frequencies, and therefore provides the amplifier 405 with additional gain boosting at high frequencies. This gain boosting is in addition to the gain boosting provided by the source capacitor 434 shorting the source resistor 432 at high frequencies, as discussed above.

It is to be appreciated that the first load 440 and the second load 450 are not limited to the exemplary implementation shown in FIG. 5. For example, the first load inductor 510 and the second load inductor 515 may be omitted (e.g., to reduce the area of the first load 440 and the second load 450).

As processing speeds continue to increase, there is a need to transmit data between devices at increasingly faster data rates. The faster data rates translate into higher frequency signals being transmitted across a channel between the devices. The higher frequency signals may experience an increased amount of attenuation (i.e., loss) in the channel. To compensate for the increased signal attenuation at faster data rates, it is desirable to increase the gain boosting of an amplifier coupled to the channel. In addition, signal attenuation (i.e., signal loss) in a channel increases as the length of the channel increases. As a result, the gain boosting of an amplifier may need to be increased in order to transmit data over a longer channel.

Thus, it is desirable to increase the gain boosting of an amplifier in order to transmit data across a channel at a faster data rate and/or transmit data over a longer channel. At the same time, it may be desirable to reduce the amount of power needed to increase the gain boosting of the amplifier, especially for the case where the amplifier is powered by a battery or another energy-limited storage device.

Figure 6:
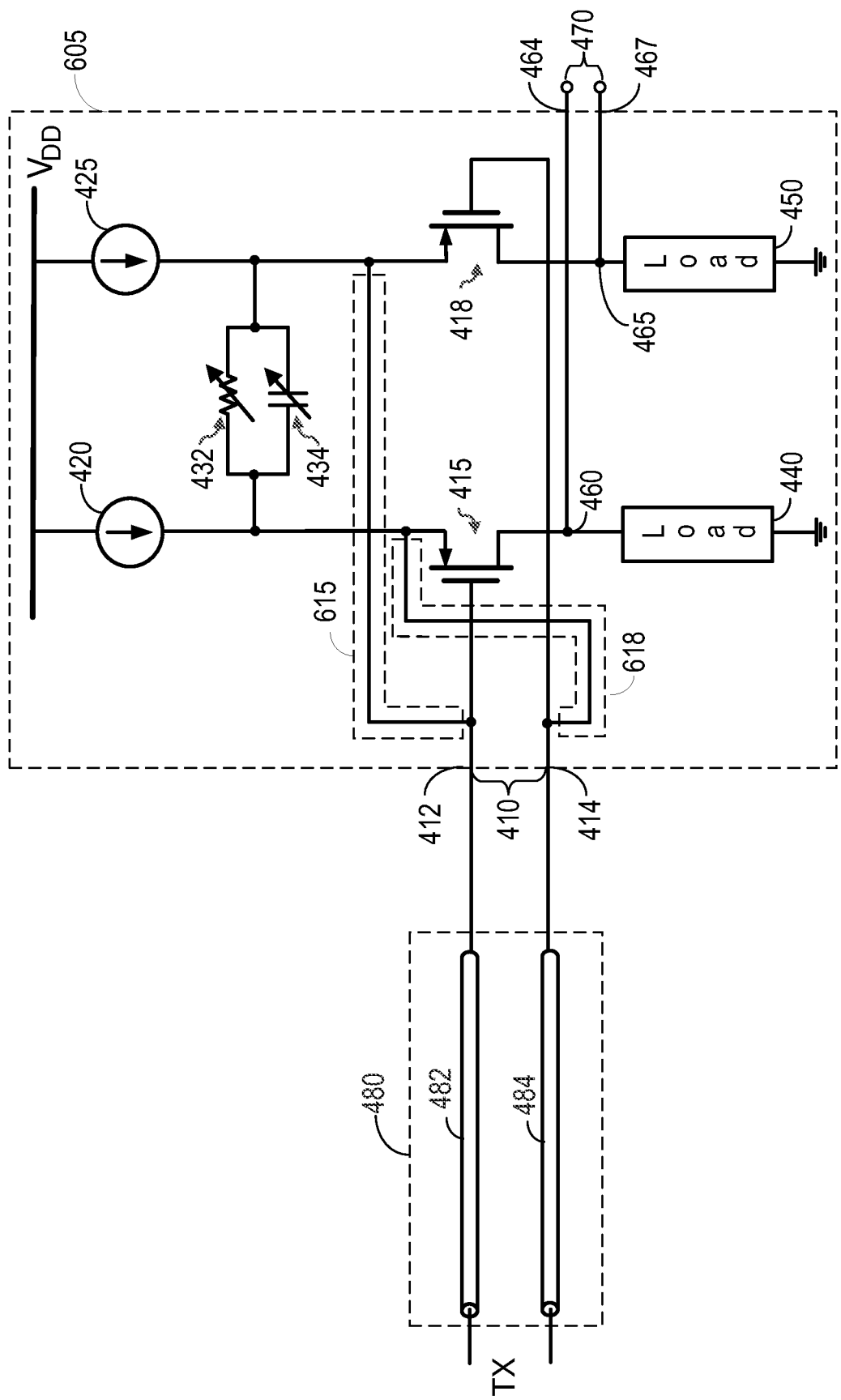
FIG. 6 shows an example of an amplifier including a first signal path and a second signal path for increasing gain according to certain aspects of the present disclosure.

FIG. 6 shows an example of an amplifier 605 according to aspects of the present disclosure. The amplifier 605 may be used to implement the amplifier 310 in the second receiver 146 and the amplifier 330 in the first receiver 136. The amplifier 605 includes the first transistor 415, the second transistor 418, the first bias current source 420, the second bias current source 425, the first load 440, the second load 450, the source resistor 432, and the source capacitor 434 discussed above with reference to FIG. 4. Since these elements are described in detail above according aspects of the present disclosure, a detailed description of these elements in not repeated here for brevity.

The amplifier 605 also includes a first signal path 615 and a second signal path 618. The first signal path 615 is coupled between the first input 412 of the amplifier 605 and the source of the second transistor 418, and the second signal path 618 is coupled between the second input 414 of the amplifier 605 and the source of the first transistor 415. As discussed further below, the first signal path 615 and the second signal path 618 increase the gain of the amplifier 605.

In operation, a differential input signal (e.g., differential data signal) is input to the differential input 410 of the amplifier 605 from the channel 480. The differential input signal includes a first input signal and a second input signal, in which the first input signal is input to the first input 412 of the amplifier 605, and the second input signal to the second input 414 of the amplifier 605. The first input signal drives the gate of the first transistor 415 and the second input signal drives the gate of the second transistor 418. The first transistor 415 converts the voltage of the first input signal into a first drive current that flows through the first load 440, and the second transistor 418 converts the voltage of the second input signal into a second drive current that flows through the second load 450.

The first signal path 615 couples the first input signal to the source of the second transistor 418. This allows the current of the first input signal to flow into the source of the second transistor 418, which has a relatively low input impedance. As a result, the current of the first input signal is added to the second drive current generated by the second transistor 418 based on the voltage of the second input signal. By adding the current of the first input signal to the second drive current generated by the second transistor 418, the first signal path 615 increases the total drive current to the second load 450.

Similarly, the second signal path 618 couples the second input signal to the source of the first transistor 415. This allows the current of the second input signal to flow into the source of the first transistor 415, which has a relatively low input impedance. As a result, the current of the second input signal is added to the first drive current generated by the first transistor 415 based on the voltage of the first input signal. By adding the current of the second input signal to the first drive current generated by the first transistor 415, the second signal path 618 increases the total drive current to the first load 440.

Thus, the first signal path 615 increases the total drive current to the second load 450, and the second signal path 618 increases the total drive current to the first load 440. The increased drive currents to the first load 440 and the second load 450 increases the gain of the amplifier 605. The increased gain allows the amplifier 605 to compensate for higher signal attenuation in the channel 480, which, in turn, allows data to be sent across the channel 480 at a higher data rate and/or the channel 480 to be longer.

The first signal path 615 and the second signal path 618 increase the gain of the amplifier 605 in a power efficient manner. This is because the first signal path 615 and the second signal path 618 increase the gain of the amplifier 605 using currents that are already provided by the first input signal and the second input signal.

In certain aspects, the first signal path 615 and the second signal path 618 provide the amplifier 605 with an input signal impedance approximately equal to ½ gm, where gm is the transconductance of the first transistor 415 and the second transistor 418. This is because the first signal path 615 couples the first input 412 of the amplifier 605 to the source of the second transistor 418 and the second signal path 618 couples the second input 414 of the amplifier 605 to the source of the first transistor 415. In these aspects, the transconductance gm of the first transistor 415 and the second transistor 418 may be set such that the input impedance of the amplifier 605 is approximately equal to the characteristic impedance of the channel 480 to provide good impedance matching with the channel 480. For example, if the characteristic impedance of the channel 480 is approximately equal to 50 ohms, then the transconductance gm of the first transistor 415 and the second transistor 418 may be set such that the input impedance of the amplifier 605 is approximately equal to 50 ohms. Thus, the first signal path 615 and the second signal path 618 may be used to provide impedance matching with the channel 480.

The transconductance gm of the first transistor 415 and the second transistor 418 may be adjusted (i.e., tuned) by adjusting the first bias current generated by the first bias current source 420 and the second bias current generated by the second bias current source 425. For the exemplary implementation of the first bias current source 420 and the second bias current source 425 shown in FIG. 5, the first bias current and the second bias current may be adjusted by adjusting the bias voltage $V_B$, as discussed above.

Figure 7:
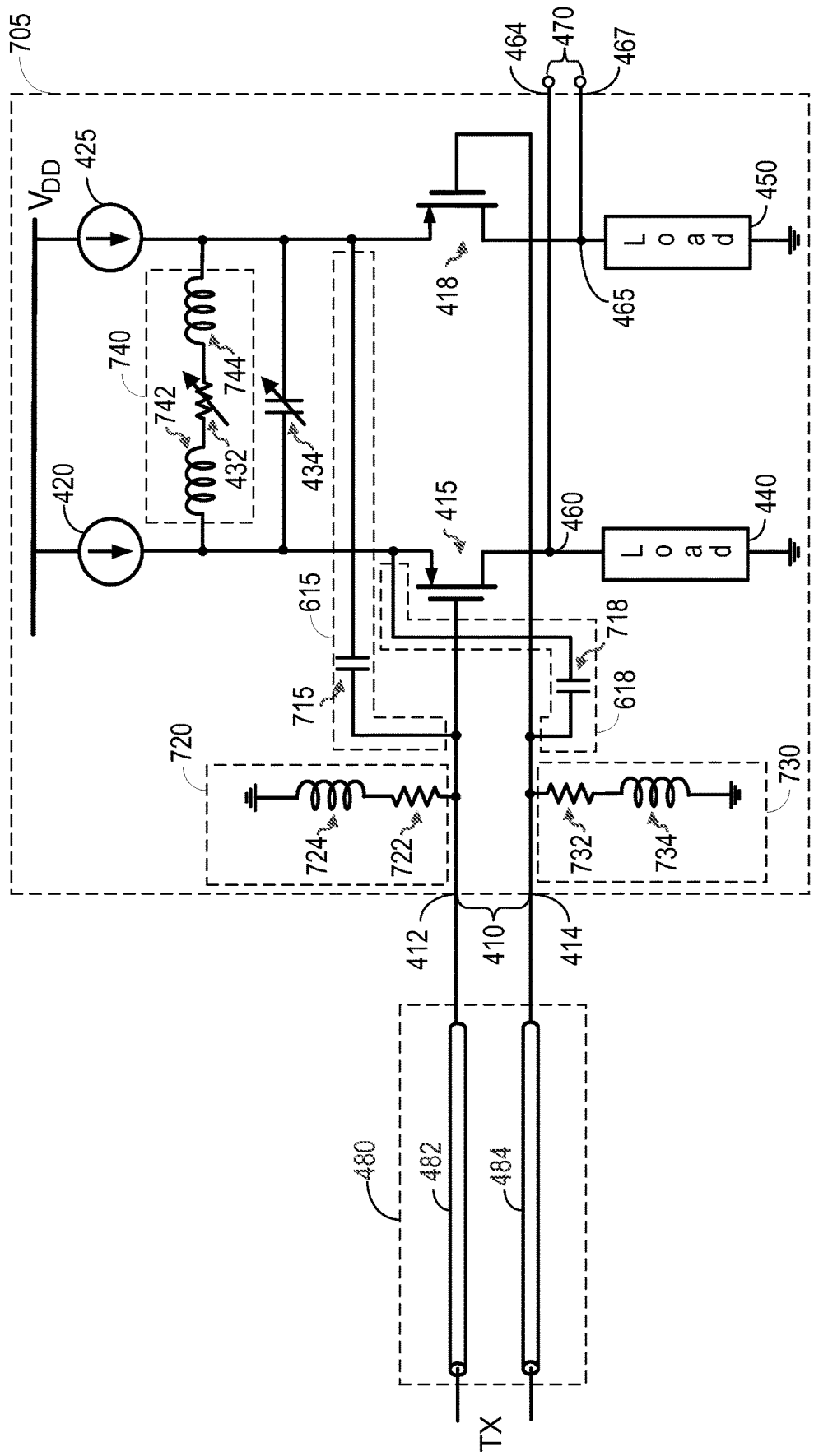
FIG. 7 shows an example in which the first signal path includes a first capacitor and the second signal path includes a second capacitor according to certain aspects of the present disclosure.

FIG. 7 shows another example of an amplifier 705 according to aspects of the present disclosure. The amplifier 705 may be used to implement the amplifier 310 in the second receiver 146 and the amplifier 330 in the first receiver 136. The amplifier 705 includes the first transistor 415, the second transistor 418, the first bias current source 420, the second bias current source 425, the first load 440, the second load 450, the source resistor 432, and the source capacitor 434 discussed above.

The amplifier 705 also includes the first signal path 615 coupled between the first input 412 of the amplifier 705 and the source of the second transistor 418, and the second signal path 618 coupled between the second input 414 of the amplifier 705 and the source of the first transistor 415. In this example, the first signal path 615 includes a first capacitor 715, and the second signal path 618 includes a second capacitor 718. In certain aspects, the first capacitor 715 is configured to have a high impedance at low frequencies and a low impedance at high frequencies. As a result, the first capacitor 715 acts as a high-pass filter that couples high-frequency components of the first input signal to the source of the second transistor 418 while substantially blocking low-frequency components of the first input signal. Similarly, the second capacitor 718 is configured to have a high impedance at low frequencies and a low impedance at high frequencies. As a result, the second capacitor 718 acts as a high-pass filter that couples high-frequency components of the second input signal to the source of the first transistor 415 while substantially blocking low-frequency components of the second input signal.

Thus, the first capacitor 715 and the second capacitor 718 couple high-frequency components of the first input signal and the second input signal to the source of the second transistor 418 and the source of the first transistor 415, respectively. As a result, the first signal path 615 and the second signal path 618 increase the gain of the amplifier 705 at high frequencies, and therefore increase the gain boosting of the amplifier 705 at high frequencies. The increased gain boosting at high frequencies allows the amplifier 605 to compensate for higher signal attenuation in the channel 480 at high frequencies.

The first capacitor 715 also helps prevent the second bias current from leaking to the first input 412 of the amplifier 705 via the first signal path 615. This is because the first capacitor 715 substantially blocks DC current, and therefore substantially blocks the second bias current assuming the second bias current is DC. By blocking the second bias current, the first capacitor 715 prevents the first signal path 615 from disturbing the biasing of the second transistor 418.

Similarly, the second capacitor 718 helps prevent the first bias current from leaking to the second input 414 of the amplifier 705 via the second signal path 618. This is because the second capacitor 718 substantially blocks DC current, and therefore substantially blocks the first bias current assuming the first bias current is DC. By blocking the first bias current, the second capacitor 718 prevents the second signal path 618 from disturbing the biasing of the first transistor 415.

In certain aspects, the first signal path 615 and the second signal path 618 provide the amplifier 705 with an input impedance approximately equal to ½ gm at high frequencies. In these aspects, the transconductance gm of the first transistor 415 and the second transistor 418 may be set such that the input impedance of the amplifier 605 is approximately equal to the characteristic impedance of the channel 480 to provide good impedance matching with the channel 480 at high frequencies. As discussed above, the transconductance gm of the first transistor 415 and the second transistor 418 may be adjusted (i.e., tuned) by adjusting the first bias current generated by the first bias current source 420 and the second bias current generated by the second bias current source 425.

In the example in FIG. 7, the amplifier 705 also includes a first impedance-matching circuit 720 and a second impedance-matching circuit 730. The first impedance-matching circuit 720 is coupled to the first input 412 of the amplifier 705, and the second impedance-matching circuit 730 is coupled to the second input 414 of the amplifier 705. As discussed further below, the first impedance-matching circuit 720 and the second impedance-matching circuit 730 are configured to provide impedance matching with the channel 480 at low frequencies.

The first impedance-matching circuit 720 includes a first resistor 722 and a first inductor 724, in which the first inductor 724 is coupled in series with the first resistor 722. The first inductor 724 is configured to have a low impedance at low frequencies and a high impedance at high frequencies. As a result, the impedance of the first impedance-matching circuit 720 is approximately equal to the impedance of the first resistor 722 at low frequencies. In certain aspects, the impedance of the first resistor 722 is approximately equal to the characteristic impedance of the channel 480 (e.g., 50 ohms) so that the first impedance-matching circuit 720 provides good impedance matching with the channel 480 at low frequencies.

The second impedance-matching circuit 730 includes a second resistor 732 and a second inductor 734, in which the second inductor 734 is coupled in series with the second resistor 732. The second inductor 734 is configured to have a low impedance at low frequencies and a high impedance at high frequencies. As a result, the impedance of the second impedance-matching circuit 730 is approximately equal to the impedance of the second resistor 732 at low frequencies. In certain aspects, the impedance of the first resistor 722 is approximately equal to the characteristic impedance of the channel 480 (e.g., 50 ohms) so that the second impedance-matching circuit 730 provides good impedance matching with the channel 480 at low frequencies.

Thus, in this example, the first impedance-matching circuit 720 and the second impedance-matching circuit 730 provide good impedance matching with the channel 480 at low frequencies, and the first signal path 615 and the second signal path 618 provide good impedance matching with the channel 480 at high frequencies.

In the example in FIG. 7, the amplifier 705 also includes a resistive-inductive circuit 740 coupled between the source of the first transistor 415 and the source of the second transistor 418. The resistive-inductive circuit 740 includes the source resistor 432, a first source inductor 742, and a second source inductor 744. The first source inductor 742 and the second source inductor 744 are coupled in series with the source resistor 432. Each of the first source inductor 742 and the second source inductor 744 is configured to have a low impedance at low frequencies and a high impedance at high frequencies. As a result, the impedance of the resistive-inductive circuit 740 is approximately equal to the impedance of the source resistor 432 at low frequencies. This allows the source resistor 432 to provide source-degenerative resistance between the source of the first transistor 415 and the source of the second transistor 418 to reduce the gain of the amplifier 705 at low frequencies, as discussed above.

At high frequencies, the resistive-inductive circuit 740 has a high impedance due to the high impedances of the first source inductor 742 and the second source inductor 744 at high frequencies. The high impedance of the resistive-inductive circuit 740 at high frequencies helps direct the current from the first signal path 615 into the source of the second transistor 418 at high frequencies to increase the total drive current to the second load 450 at high frequencies. Similarly, the high impedance of the resistive-inductive circuit 740 at high frequencies helps direct the current from the second signal path 618 into the source of the first transistor 415 at high frequencies to increase the total drive current to the first load 440 at high frequencies. In addition, the capacitor 434 may be tuned to provide a high impedance at high frequencies to help direct the current from the first signal path 615 into the source of the second transistor 418 and direct the current from the second signal path 618 into the source of the first transistor 415. The increased drive currents to the first load 440 and the second load 450 at high frequencies increase the gain boosting of the amplifier 705 at high frequencies. The increased gain boosting at high frequencies allows the amplifier 705 to compensate for high signal attenuation in the channel 480 at high frequencies.

In this example, source degeneration from the source resistor 432 reduces the transconductance of the amplifier 705 at low frequencies, which reduces the gain of the amplifier 705 at low frequencies. At high frequencies, the source of the first transistor 415 is coupled to the second input 414 via the second signal path 618 and the gate of the first transistor 415 is coupled to the first input 412. Similarly, the source of the second transistor 418 is coupled to the first input 412 via the first signal path 615 and the gate of the second transistor 418 is coupled to the second input 414. As a result, a signal swing of 2 vin is applied across the gate-to-source of each of the first transistor 415 and the second transistor 418 at high frequencies, where vin is the amplitude of the differential input signal. This boosts the transconductance of the amplifier 705 to approximately 2 gm at high frequencies, which boosts the gain of the amplifier 705 at high frequencies. In contrast, the amplifier 405 in FIG. 4 achieves gain boosting at high frequencies by shorting the source-degenerative resistance of the source resistor 432 at high frequencies using the capacitor 434. Since the capacitor 434 is not needed to short the source-degenerative resistance in this example, the capacitor 434 may be turned off or omitted.

Figure 8:
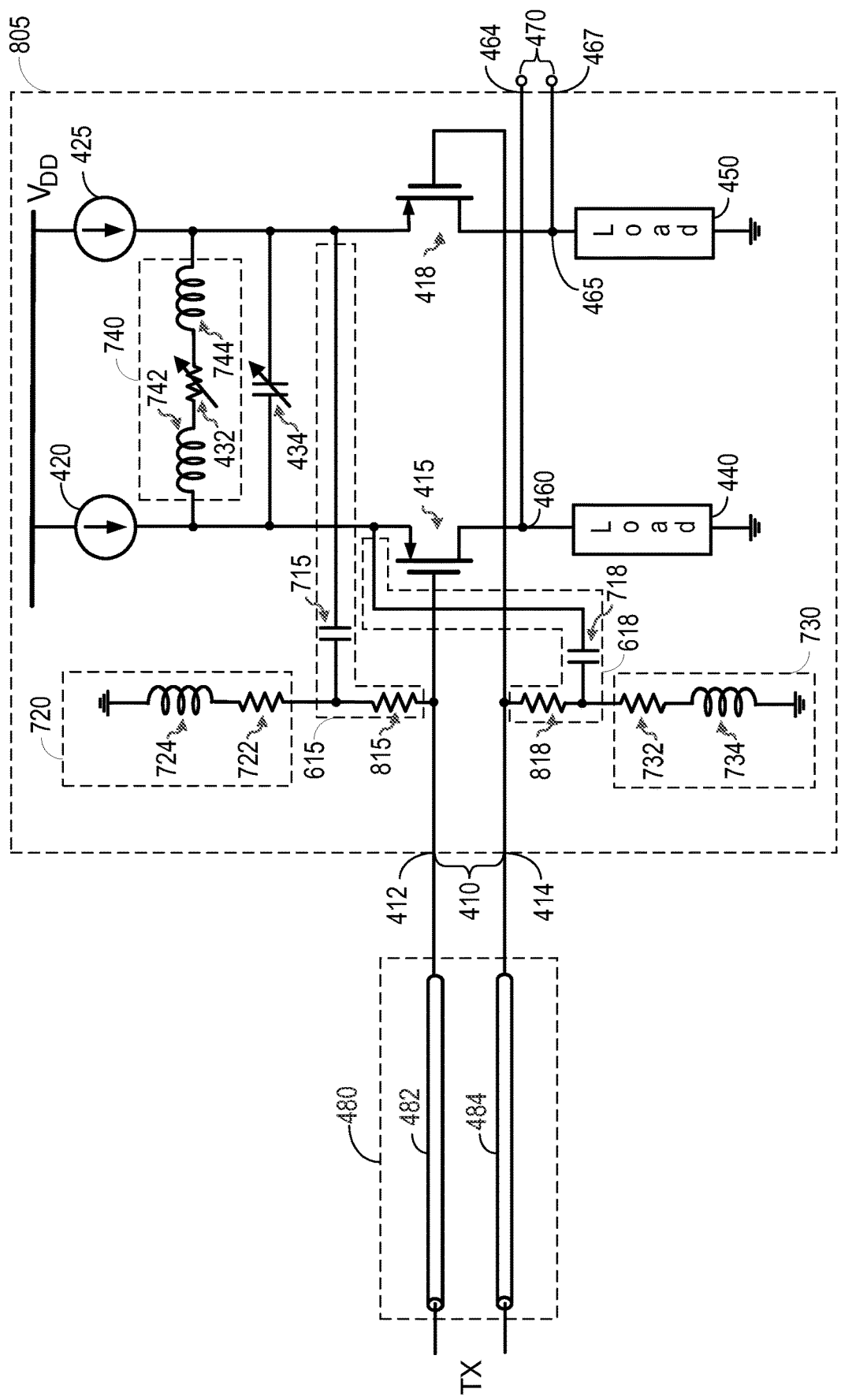
FIG. 8 shows an example in which the first signal path includes a first resistor and the second signal path includes a second resistor according to certain aspects of the present disclosure.

FIG. 8 shows another example of an amplifier 805 according to aspects of the present disclosure. The amplifier 805 may be used to implement the amplifier 310 in the second receiver 146 and the amplifier 330 in the first receiver 136. The amplifier 805 includes the first transistor 415, the second transistor 418, the first bias current source 420, the second bias current source 425, the first load 440, the second load 450, the source capacitor 434, and the resistive-inductive circuit 740 discussed above.

The amplifier 805 also includes the first signal path 615 coupled between the first input 412 of the amplifier 805 and the source of the second transistor 418, and the second signal path 618 coupled between the second input 414 of the amplifier 805 and the source of the first transistor 415. In this example, the first signal path 615 includes the first capacitor 715, and the second signal path 618 includes the second capacitor 718 discussed above. The first signal path 615 also includes a third resistor 815 coupled in series with the first capacitor 715, and the second signal path 618 includes a fourth resistor 818 coupled in series with the second capacitor 718. Assuming the third resistor 815 and the fourth resistor 818 have approximately the same resistance, the input impedance provided by the first signal path 615 and the second signal path 618 at high frequencies is approximately equal to:

$$\text{iput impedance at high frequencies} = R_B + \frac{1}{2\,\text{gm}} \qquad (1)$$

where $R_B$ is the resistance of each of the third resistor 815 and the fourth resistor 818. Thus, in this example, the third resistor 815 and the fourth resistor 818 increase the input impedance of the amplifier 805 at high frequencies. The third resistor 815 and the fourth resistor 818 may be used to increase the input impedance at high frequencies for cases where the impedance provided by ½ gm is not high enough to provide impedance matching with the channel 480. For example, if the characteristic impedance of the channel 480 is 50 ohms and ½ gm provides an impedance of 30 ohms, then the resistance of each of the third resistor 815 and the fourth resistor 818 may be approximately 20 ohms to provide an input impedance of 50 ohms to match the characteristic impedance of the channel 480.

In the example in FIG. 8, the first impedance-matching circuit 720 is coupled to the third resistor 815, and the second impedance-matching circuit 730 is coupled to the fourth resistor 818. Assuming the first resistor 722 and the second resistor 732 have approximately the same resistance, the input impedance at low frequencies is approximately equal to:

$$\text{input impedance at low frequencies} = R_B + R_{Im} \qquad (2)$$

where $R_B$ is the resistance of each of the third resistor 815 and the fourth resistor 818, and $R_{Im}$ is the resistance of each of the first resistor 722 and the second resistor 732. Thus, in this example, the input impedance of the amplifier 805 at low frequencies is approximately equal to the sum of $R_B$ and $R_{Im}$. For a given $R_B$, the resistance of each of the first resistor 722 and the second resistor 732 may be chosen to provide impedance matching with the channel 480 at low frequencies. For example, if the characteristic impedance of the channel 480 is 50 ohms and $R_B$ is 20 ohms, then the resistance of each of the first resistor 722 and the second resistor 732 may be approximately 30 ohms to provide an input impedance of 50 ohms to match the characteristic impedance of the channel 480.

Figure 9:
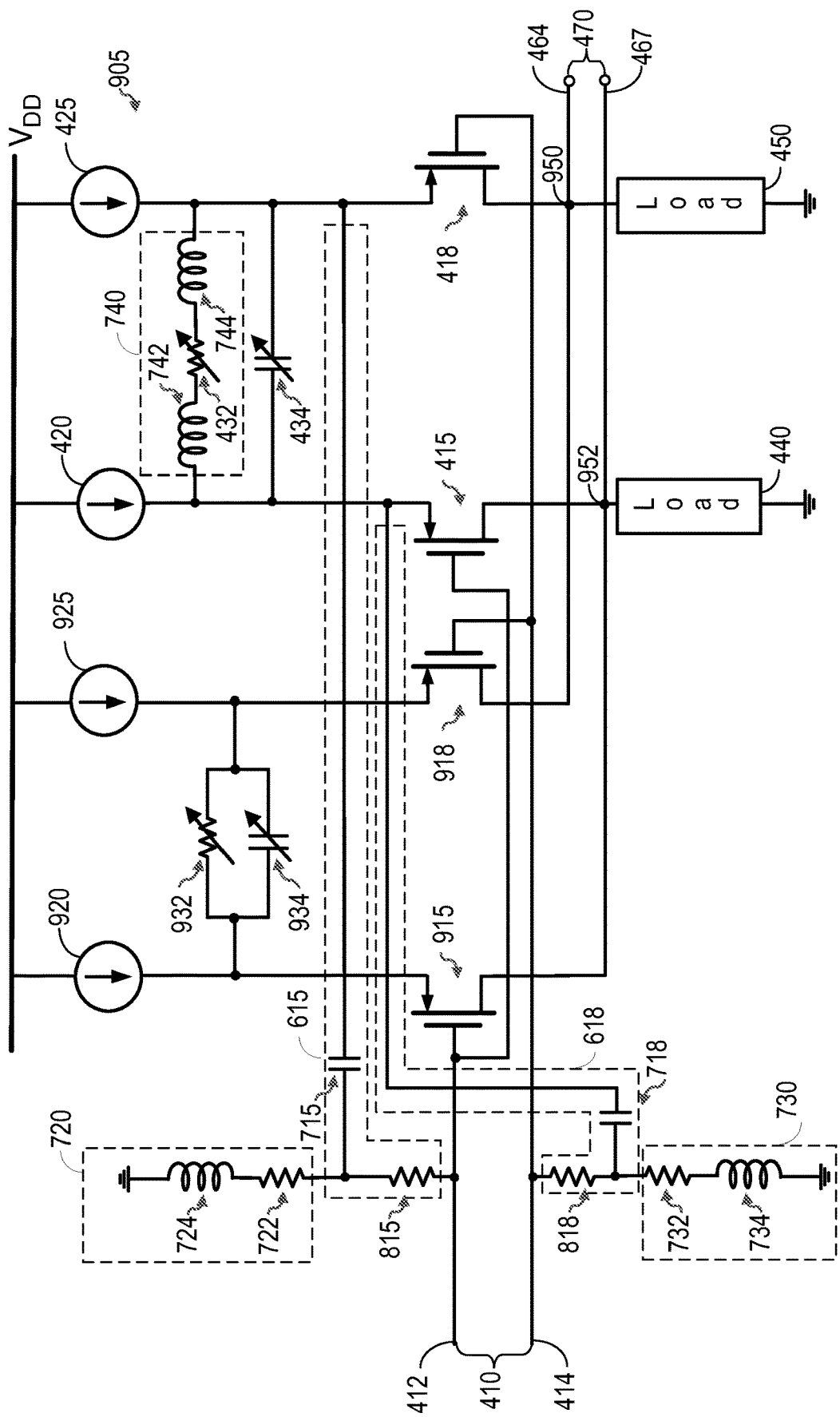
FIG. 9 shows another example of an amplifier according to certain aspects of the present disclosure.

FIG. 9 shows another example of an amplifier 905 according to aspects of the present disclosure. The amplifier 905 may be used to implement the amplifier 310 in the second receiver 146 and the amplifier 330 in the first receiver 136. In this example, the amplifier 905 includes the elements of the amplifier 805 shown in FIG. 8. The amplifier 905 also includes a third transistor 915, a fourth transistor 918, a third bias current source 920, a fourth bias current source 925, a second source resistor 932 and a second source capacitor 934.

The third bias current source 920 is coupled to the source of the third transistor 915, and is configured to generate a third bias current to bias the third transistor 915. The fourth bias current source 925 is coupled to the source of the fourth transistor 918, and is configured to generate a fourth bias current to bias the fourth transistor 918. The third bias current and the fourth bias current may each be a DC current, and may have approximately the same current level.

The gate of the third transistor 915 is coupled to the first input 412 of the amplifier 905, and the gate of the fourth transistor 918 is coupled to the second input 414 of the amplifier 905. The drain of the third transistor 915 is coupled to the first load 440, and the drain of the fourth transistor 918 is coupled to the second load 450. The second source resistor 932 and the second source capacitor 934 are coupled in parallel between the source of the third transistor 915 and the source of the fourth transistor 918.

As discussed above, the differential input signal (e.g., differential data signal) input to the differential input 410 of the amplifier 905 includes the first input signal and the second input signal. The first input signal drives the gate of the third transistor 915 in addition to the gate of the first transistor 415 discussed above. The third transistor 915 converts the voltage of the first input signal into a drive current, which is combined with the drive current from the first transistor 415 into a first combined drive current at node 952. The first combined current flows through the first load 440. The second input signal drives the gate of the fourth transistor 918 in addition to the gate of the second transistor 418 discussed above. The fourth transistor 918 converts the voltage of the second input signal into a drive current, which is combined with the drive current from the second transistor 418 into a second combined drive current at node 950. The second combined drive current flows through the second load 450.

Thus, in this example, the drive current to the first load 440 is the combined drive currents of the first transistor 415 and the third transistor 915 (i.e., the first combined drive current), and the drive current to the second load 450 is the combined drive currents of the second transistor 418 and the fourth transistor 918 (i.e., the second combined drive current). In the example in FIG. 9, the first output 464 of the amplifier 905 is coupled to node 950 and the second output 467 of the amplifier 905 is coupled to node 952.

For cases where the impedance provided by ½ gm is not high enough to provide impedance matching with the channel 480, the additional drive currents provided by the third transistor 915 and the fourth transistor 918 allow the transconductance gm of the first transistor 415 and the second transistor 418 to be decreased to increase ½ gm while maintaining the gain of the amplifier 905. This is because the additional drive currents provided by the third transistor 915 and the fourth transistor 918 can be used to compensate for decreases in the drive currents from the first transistor 415 and the second transistor 418 caused by decreasing the transconductance gm of the first transistor 415 and the second transistor 418 to increase ½ gm. Thus, the third transistor 915 and the fourth transistor 918 allow the impedance provided by ½ gm is be increased to more closely match the characteristic impedance of the channel 480 while maintaining the gain of the amplifier 905.

The transconductance gm of the first transistor 415 and the second transistor 418 may be decreased to increase ½ gm by decreasing the first bias current and the second bias current. For the exemplary implementation of the first bias current source 420 and the second bias current source 425 shown in FIG. 5, the first bias current and the second bias current may be decreased by increasing the bias voltage $V_B$.

In cases where the third transistor 915 and the fourth transistor 918 allow the impedance provided by ½ gm is be increased enough to approximately match the characteristic impedance of the channel 480, the third resistor 815 may be omitted from the first signal path 615 and the fourth resistor 818 may be omitted from the second signal path 618. Also, the first impedance-matching circuit 720 may be coupled to the first input 412, and the second impedance-matching circuit 730 may be coupled to the second input 414 as shown in the example in FIG. 7.

Figure 10:
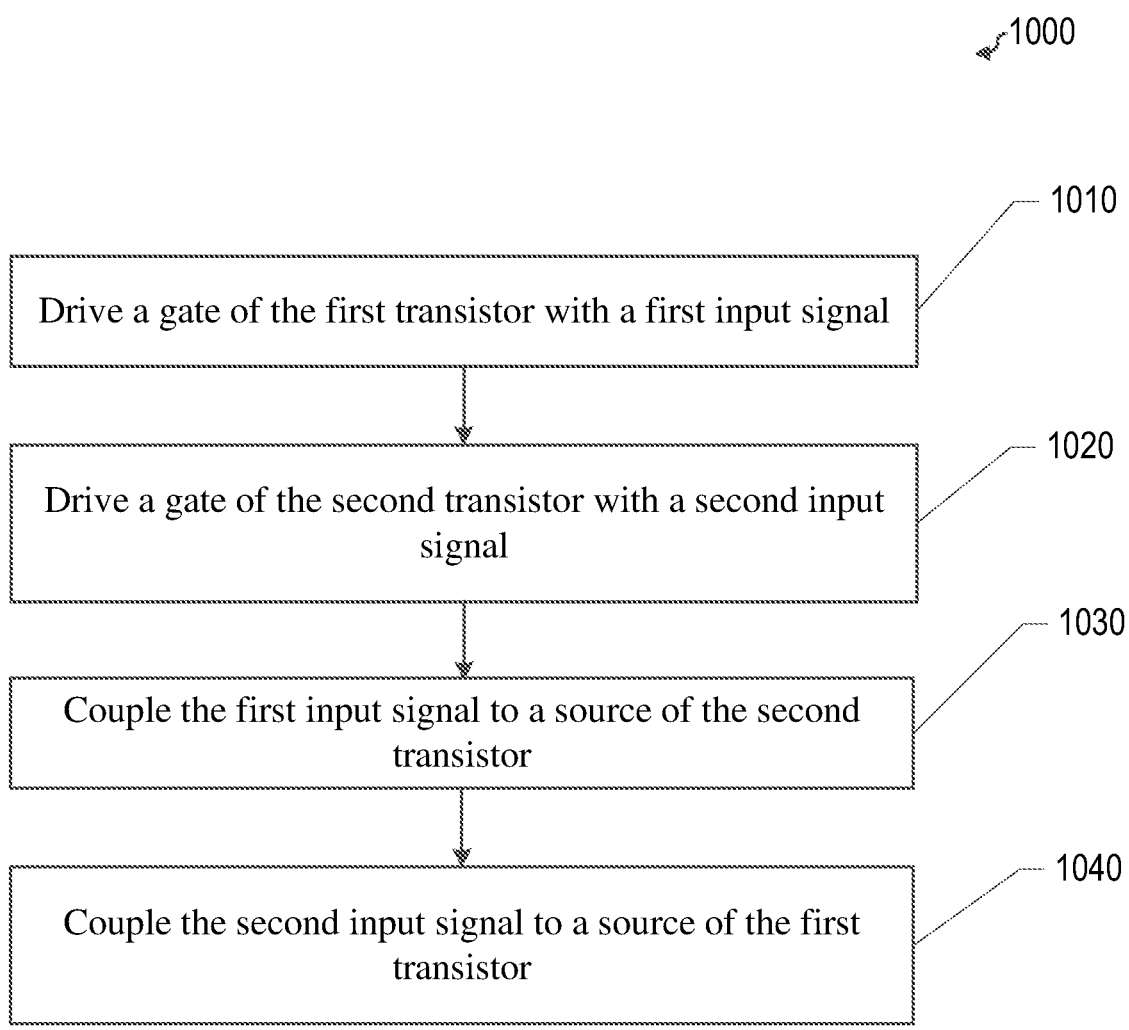
FIG. 10 is a flowchart illustrating a method for increasing a gain of an amplifier according to certain aspects of the present disclosure.

FIG. 10 is a flowchart illustrating a method 1000 for increasing a gain of an amplifier according to certain aspects of the present disclosure. The amplifier includes a first transistor (e.g., first transistor 415), a second transistor (e.g., second transistor 418), a first load (e.g., first load 440) coupled to a drain of the first transistor, and a second load (e.g., second load 450) coupled to a drain of the second transistor.

At block 1010, a gate of the first transistor is driven with a first input signal. For example, the gate of the first transistor (e.g., first transistor 415) may be driven by a first input (e.g., first input 412) coupled to the gate of the first transistor and configured to receive the first input signal (e.g., from a first transmission line 482 of a channel 480).

At block 1020, a gate of the second transistor is driven with a second input signal. For example, the gate of the second transistor (e.g., second transistor 418) may be driven by a second input (e.g., second input 414) coupled to the gate of the second transistor and configured to receive the second input signal (e.g., from a second transmission line 484 of a channel 480).

At block 1030, the first input signal is coupled to a source of the second transistor. For example, the first input signal may be coupled to the source of the second transistor by a first signal path (e.g., first signal path 615).

At block 1040, the second input signal is coupled to a source of the first transistor. For example, the second input signal may be coupled to the source of the first transistor by a second signal path (e.g., second signal path 618).

In one example, coupling the first input signal to the source of the second transistor includes coupling the first input signal to the source of the second transistor via a first capacitor (e.g., first capacitor 715), and coupling the second input signal to the source of the first transistor includes coupling the second input signal to the source of the first transistor via a second capacitor (e.g., second capacitor 718).

In another example, coupling the first input signal to the source of the second transistor includes coupling the first input signal to the source of the second transistor via a first capacitor (e.g., first capacitor 715) and a first resistor (e.g., third resistor 815) coupled in series, and coupling the second input signal to the source of the first transistor includes coupling the second input signal to the source of the first transistor via a second capacitor (e.g., second capacitor 718) and a second resistor (e.g., fourth resistor 818) coupled in series.

In another example, coupling the first input signal to the source of the second transistor includes inputting a current of the first input signal to the source of the second transistor (e.g., via the first signal path 615), and coupling the second input signal to the source of the first transistor includes inputting a current of the second input signal to the source of the first transistor (e.g., via the second signal path 618).

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

The invention claimed is:

1. An amplifier, comprising:
a first transistor including a gate, a drain, and a source, wherein the gate of the first transistor is coupled to a first input of the amplifier;
a second transistor including a gate, a drain, and a source, wherein the gate of the second transistor is coupled to a second input of the amplifier;
a first signal path coupled between the first input of the amplifier and the source of the second transistor, wherein the first signal path comprises a first resistor and a first capacitor coupled in series;
a second signal path coupled between the second input of the amplifier and the source of the first transistor, wherein the second signal path comprises a second resistor and a second capacitor coupled in series;
a first load coupled to the drain of the first transistor; and
a second load coupled to the drain of the second transistor.

2. The amplifier of claim 1, further comprising:
a third resistor coupled between the source of the first transistor and the source of the second transistor; and
a third capacitor coupled between the source of the first transistor and the source of the second transistor.

3. The amplifier of claim 1, further comprising a first bias current source coupled to the source of the first transistor, and a second bias current source coupled to the source of the second transistor.

4. The amplifier of claim 1, further comprising:
a first impedance-matching circuit coupled to the first resistor, the first impedance-matching circuit comprising:
a third resistor; and
a first inductor coupled in series with the third resistor; and
a second impedance-matching circuit coupled to the second resistor, the second impedance-matching circuit comprising:
a fourth resistor; and
a second inductor coupled in series with the fourth resistor.

5. The amplifier of claim 1, wherein the first load comprises a first load resistor, and the second load comprises a second load resistor.

6. The amplifier of claim 5, wherein the first load further comprises a first load inductor coupled in series with the first load resistor, and the second load further comprises a second load inductor coupled in series with the second load resistor.

7. The amplifier of claim 6, wherein the first load is coupled between the drain of the first transistor and a ground, and the second load is coupled between the drain of the second transistor and the ground.

8. The amplifier of claim 1, wherein the first transistor comprises a first p-type field effect transistor (PFET) and the second transistor comprises a second PFET.

9. The amplifier of claim 8, wherein the first load is coupled between the drain of the first transistor and a ground, and the second load is coupled between the drain of the second transistor and the ground.

10. The amplifier of claim 9, further comprising a first bias current source coupled between the source of the first transistor and a voltage supply rail, and a second bias current source coupled between the source of the second transistor and the voltage supply rail.

11. An amplifier, comprising:
a first transistor including a gate, a drain, and a source, wherein the gate of the first transistor is coupled to a first input of the amplifier;
a second transistor including a gate, a drain, and a source, wherein the gate of the second transistor is coupled to a second input of the amplifier;
a first signal path coupled between the first input of the amplifier and the source of the second transistor, wherein the first signal path comprises a first capacitor;
a second signal path coupled between the second input of the amplifier and the source of the first transistor, wherein the second signal path comprises a second capacitor;
a first load coupled to the drain of the first transistor;
a second load coupled to the drain of the second transistor; and
a resistive-inductive circuit coupled between the source of the first transistor and the source of the second transistor, the resistive-inductive circuit comprising:
a resistor;
a first inductor; and
a second inductor, wherein the first inductor and the second inductor are coupled in series with the resistor.

12. The amplifier of claim 11, further comprising a third capacitor coupled between the source of the first transistor and the source of the second transistor.

13. An amplifier, comprising:
a first transistor including a gate, a drain, and a source, wherein the gate of the first transistor is coupled to a first input of the amplifier;
a second transistor including a gate, a drain, and a source, wherein the gate of the second transistor is coupled to a second input of the amplifier;
a first signal path coupled between the first input of the amplifier and the source of the second transistor;
a second signal path coupled between the second input of the amplifier and the source of the first transistor;
a first load coupled to the drain of the first transistor;
a second load coupled to the drain of the second transistor;
a first impedance-matching circuit coupled to the first input of the amplifier, the first impedance-matching circuit comprising:
a first resistor; and
a first inductor coupled in series with the first resistor; and
a second impedance-matching circuit coupled to the second input of the amplifier, the second impedance-matching circuit comprising:
a second resistor; and a second inductor coupled in series with the second resistor.

14. The amplifier of claim 13, wherein the first signal path comprises a first capacitor, and the second signal path comprises a second capacitor.

15. An amplifier, comprising:
a first transistor including a gate, a drain, and a source, wherein the gate of the first transistor is coupled to a first input of the amplifier;
a second transistor including a gate, a drain, and a source, wherein the gate of the second transistor is coupled to a second input of the amplifier;
a first signal path coupled between the first input of the amplifier and the source of the second transistor;
a second signal path coupled between the second input of the amplifier and the source of the first transistor;
a first load coupled to the drain of the first transistor;
a second load coupled to the drain of the second transistor;
a third transistor including a gate, a drain, and a source, wherein the gate of the third transistor is coupled to the first input of the amplifier, and the drain of the third transistor is coupled to the first load; and
a fourth transistor including a gate, a drain, and a source, wherein the gate of the fourth transistor is coupled to the second input of the amplifier, and the drain of the fourth transistor is coupled to the second load.

16. The amplifier of claim 15, wherein the first signal path comprises a first capacitor, and the second signal path comprises a second capacitor.

17. The amplifier of claim 16, wherein the first signal path further comprises a first resistor coupled in series with the first capacitor, and the second signal path further comprises a second resistor coupled in series with the second capacitor.

18. The amplifier of claim 15, further comprising:
a first bias current source coupled to the source of the first transistor;
a second bias current source coupled to the source of the second transistor;
a third bias current source coupled to the source of the third transistor; and
a fourth bias current source coupled to the source of the fourth transistor.

19. A system, comprising:
a transmitter;
a channel coupled to an output of the transmitter, the channel comprising a first transmission line and a second transmission line;
an amplifier having a first input and a second input, wherein the first input is coupled to the first transmission line of the channel, the second input is coupled to the second transmission line of the channel, and the amplifier comprises:
a first transistor including a gate, a drain, and a source, wherein the gate of the first transistor is coupled to the first input of the amplifier;
a second transistor including a gate, a drain, and a source, wherein the gate of the second transistor is coupled to the second input of the amplifier;
a first signal path coupled between the first input of the amplifier and the source of the second transistor, wherein the first signal path comprises a first resistor and a first capacitor coupled in series;
a second signal path coupled between the second input of the amplifier and the source of the first transistor, wherein the first signal path comprises a second resistor and a second capacitor coupled in series;
a first load coupled to the drain of the first transistor; and
a second load coupled to the drain of the second transistor.

20. The system of claim 19, wherein the amplifier further comprises:
a third resistor coupled between the source of the first transistor and the source of the second transistor; and
a third capacitor coupled between the source of the first transistor and the source of the second transistor.

21. The system of claim 19, further comprising a first bias current source coupled to the source of the first transistor, and a second bias current source coupled to the source of the second transistor.

22. The system of claim 19, wherein the transmitter is integrated on a first chip, and the amplifier is integrated on a second chip.

23. The system of claim 22, wherein the system further comprises a substrate, the first chip and the second chip are mounted on the substrate, the first transmission line of the channel comprises a first metal trace on the substrate, and the second transmission line of the channel comprises a second metal trace on the substrate.

24. The system of claim 19, wherein the amplifier has a first output coupled between the drain of the first transistor and the first load, the amplifier has a second output coupled between the drain of the second transistor and the second load, and the system further comprises:
a slicer coupled to the first output and the second output of the amplifier.

25. The system of claim 24, further comprising:
a deserializer having an input and an output, wherein the input of the deserializer is coupled to an output of the slicer; and
a processor coupled to the output of the deserializer.

26. A method for increasing a gain of an amplifier, wherein the amplifier includes a first transistor, a second transistor, a first load coupled to a drain of the first transistor, and a second load coupled to a drain of the second transistor, the method comprising:
driving a gate of the first transistor with a first input signal;
driving a gate of the second transistor with a second input signal;
coupling the first input signal to a source of the second transistor via a first capacitor and a first resistor coupled in series; and
coupling the second input signal to a source of the first transistor via a second capacitor and a second resistor coupled in series.

27. The method of claim 26, wherein:
coupling the first input signal to the source of the second transistor comprises inputting a current of the first input signal to the source of the second transistor; and
coupling the second input signal to the source of the first transistor comprises inputting a current of the second input signal to the source of the first transistor.

28. The method of claim 26, further comprising:
biasing the first transistor with a first bias current; and
biasing the second transistor with a second bias current.

29. The method of claim 26, wherein the amplifier includes a third resistor coupled between the source of the first transistor and the source of the second transistor, and a third capacitor coupled the source of the first transistor and the source of the second transistor.

30. An apparatus for increasing a gain of an amplifier, wherein the amplifier includes a first transistor, a second transistor, a first load coupled to a drain of the first transistor, and a second load coupled to a drain of the second transistor, the apparatus comprising:
- means for driving a gate of the first transistor with a first input signal;
- means for driving a gate of the second transistor with a second input signal;
- means for coupling the first input signal to a source of the second transistor via a first capacitor and a first resistor coupled in series; and
- means for coupling the second input signal to a source of the first transistor via a second capacitor and a second resistor coupled in series.

* * * * *